United States Patent [19]

Morimoto et al.

[11] 4,451,499
[45] * May 29, 1984

[54] METHOD FOR PRODUCING A BERYLLIUM OXIDE FILM

[75] Inventors: Kiyoshi Morimoto, Mobara; Toshinori Takagi, Nagaokakyo; Hiroshi Watanabe, Mobara, all of Japan

[73] Assignee: Futaba Denshi Kogyo Kabushiki Kaisha, Mobara, Japan

[*] Notice: The portion of the term of this patent subsequent to Jul. 22, 1997 has been disclaimed.

[21] Appl. No.: 403,151

[22] Filed: Jul. 29, 1982

Related U.S. Application Data

[63] Continuation of Ser. No. 168,103, Jul. 14, 1980, abandoned.

[30] Foreign Application Priority Data

Jul. 24, 1979 [JP] Japan .................................. 54-93166

[51] Int. Cl.³ ............................................. B05D 5/12
[52] U.S. Cl. ................................... 427/38; 427/255.3; 427/126.3; 204/192 N; 156/614; 156/611; 118/723; 118/50.1
[58] Field of Search ............... 427/255.1, 255.3, 126.3, 427/38; 118/723, 50.1; 204/192 N; 156/608, 610, 611, 614

[56] References Cited

U.S. PATENT DOCUMENTS

| | | | |
|---|---|---|---|
| 3,373,051 | 3/1968 | Chu et al. | 427/126.3 X |
| 3,925,116 | 12/1975 | Engel | 204/192 N X |
| 4,090,100 | 5/1978 | Byrum, Jr. | 313/634 |
| 4,147,573 | 4/1979 | Morimoto | 204/192 N X |
| 4,197,814 | 4/1980 | Takagi et al. | 204/192 N X |
| 4,213,844 | 7/1980 | Morimoto et al. | 204/192 N X |
| 4,227,961 | 10/1980 | Takagi | 204/192 N X |

Primary Examiner—John D. Smith
Assistant Examiner—Bernard F. Plantz
Attorney, Agent, or Firm—Oblon, Fisher, Spivak, McClelland & Maier

[57] ABSTRACT

A beryllium oxide (BeO) film is disclosed, which is produced by impinging partially ionized vapor of metal beryllium and oxygen upon a substrate.

6 Claims, 4 Drawing Figures

X-RAY DIFFRACTION PATTRN OF
BeO FILM GLASS SUBSTRATE

METHOD FOR PRODUCING A BERYLLIUM OXIDE FILM

BACKGROUND OF THE INVENTION

This is a continuation of application Ser. No. 168,103, filed July 14, 1980, now abandoned.

This invention relates to a beryllium oxide (BeO) film and a method of producing the same.

Beryllium oxide (BeO) crystallizes in a hexagonal wurtzite structure and is excellent in insulating characteristics, because of the large forbidden band gap of 11.2 eV and the resistivity of $10^{10}$ $\Omega$.cm. In addition, the specific inductive capacity of the BeO is 6–8 which is relatively small as compared with $Al_2O_3$. The BeO is excellent in electric and thermal conductive characteristics and is chemically stable. Accordingly, it has been extensively used in electric parts for microwave appliances, an inner liner of high temperature combusion chamber, a moderator or reflector of nuclear reactor, a window flame of X-ray tube and the like.

Furthermore, the BeO is extremely high in the melting point which is 2,570° C. and is difficult to be formed in a thin film. Thus, the BeO used in the prior art devices is formed by pressing BeO fine powders in a shape of plate by the hot press method. In the other prior art process, a monocrystalline BeO has been tried to grow by the flux method using molybdenum oxide ($MoO_3$) as a flux. However, the BeO produced by this method is the monocrystalline chip and has not yet been used in industry.

As explained hereinabove, the BeO has the high thermal conductivity and the high insulating properties. In addition, the mechanical hardness is extremely high which is Morse hardness 9. Accordingly, if the PeO film is directly formed on a surface of various parts or devices, it is possible to coat the surface of these devices with a overcoat which is excellent in anti-abrasion and thermal radiation properties, and the BeO film is anticipated to be extensively used as a coating material for various tools or a heat radiating overcoat for an equipment which generates high temperature.

In view of the above circumstances, the inventors have made extensive research and experiments to obtain the BeO film and finally completed this invention based on the findings that the thin BeO film can be directly formed on a substrate surface by impinging partially ionized vapor of metal beryllium upon the substrate surface together with oxygen.

SUMMARY OF THE INVENTION

Therefore, it is an object of the present invention to provide a beryllium oxide (BeO) film which is excellent in anti-abrasion, electrical insulation and heat conductive properties.

It is another object of the present invention to provide a beryllium oxide (BeO) film which is excellent in the crystalline state and high in adhesion strength with respect to a substrate.

It is still another object of the present invention to provide a transparent beryllium oxide (BeO) film which is as thin as micron order and is advantageously applicable for optical devices.

It is further object of the present invention to provide a novel method of producing extremely thin beryllium oxide (BeO) film.

Briefly, the foregoing and other object are attained by providing a beryllium oxide film produced by impinging partially ionized vapor of metal beryllium (BeO) and oxygen upon a substrate and a method of producing such beryllium oxide (BeO) film which comprises the steps of heating and vaporizing metal beryllium filled in a closed type crucible with at least one injection nozzle to form vapor of the beryllium, injecting the vapor through the injection nozzle into oxygen atmosphere the pressure of which is kept at $10^{-2}$ or less of the vapor pressure in the crucible, thereby forming a vapor stream of the beryllium, ionizing at least a part of the vapor stream by irradiating electron beams to the vapor stream to produce ionized vapor stream, and permitting the ionized and non-ionized vapor stream to collide with a substrate surface together with oxygen by kinetic energy at the time of injecting the vapor through the injection nozzle thereby forming a beryllium oxide (BeO) film deposited thereon.

BRIEF DESCRIPTION OF THE DRAWINGS

The exact nature of this invention, as well as other objects and advantages thereof, will be readily apparent from consideration of the following specification relating to the annexed drawings in which.

DESCRIPTION OF THE PREFERRED EMBODIMENTS

A beryllium oxide (BeO) film and a method of producing the same according to the present invention will now be described in connection with the drawings.

Figure 1:
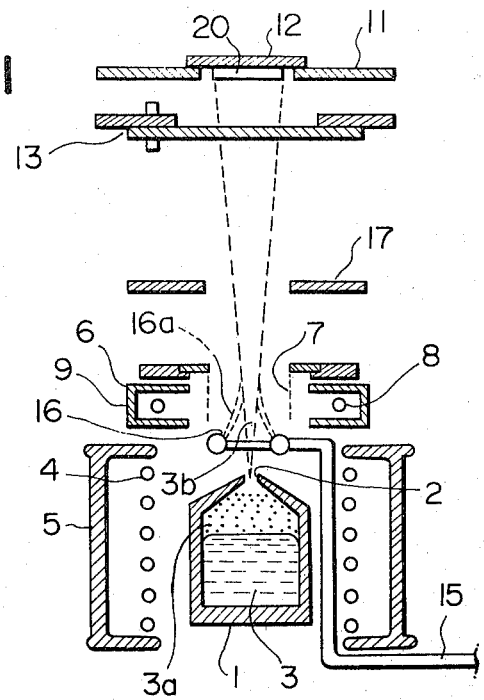
FIG. 1 is a schematic diagram of an embodiment of an apparatus for producing a beryllium oxide (BeO) film according to the present invention.

FIG. 1 is a schematic diagram of an apparatus for producing the BeO film according to the present invention. The apparatus shown in FIG. 1 includes a closed type crucible having at least one nozzle 2 of 0.5 mm–2.0 mm in diameter. The thickness of the nozzle 2 in the axial direction is as thin as possible, preferably thinner than the diameter of the nozzle 2 so that the aspect ratio may be less than 1. The crucible 1 is filled with a metal beryllium 3 which is in a shape of flake or formed in a shape of pellet by having the flaky beryllium suitably processed.

The crucible 1 is surrounded by a heater 4. In the embodiment shown in FIG. 1, the heater 4 is of electron bombardment type which heats the crucible 1 by a filamentous coil for emitting electrons disposed around the crucible 1 and elevates the temperature of the crucible by applying positive potential to the crucible by a power source (not shown), thereby accelerating the electrons emitted from the filament and bombarding the electrons upon the crucible surface. In an alternate embodiment for heating the crucible 1, if the crucible 1 is made of an electric conductive material, terminals may be provided witth upper and lower parts of the crucible 1, and the crucible 1 may be heated by resistance heating which applies a low voltage high electric current to the crucible 1 so as to heat the entire crucible 1. It is a matter of course that the crucible 1 can be heated by radiation heating disposing a heater around the crucible 1 or by a combination of these heatings. Numeral 5 designates a thermal shielding plate for the heater.

An ionization chamber 9 is provided above the crucible 1, which consists of a net-shaped anode 7 which is circular or square cylindrical or arranged in a shape of parallel plates so as to enclose vapour path of the metal Be which will be hereinafter described, a filament 8 for emitting electrons which is disposed around the anode 7, and a shielding plate 9.

The BeO film forming apparatus shown in FIG. 1 further includes a substrate holder 11 for holding a substrate 12 on which the BeO film is deposited and a shutter 13 for preventing the beryllium (Be) or oxygen (O) from impinging upon the substrate 12 when unnecessary. It is to be understood that any optional substrate, for instance, metallic substrate, semiconductor substrate, insulating substrate made of glass, ceramics, sapphire and the like may be used as the substrate 12. Numeral 15 designates an oxygen supply pipe having a plurality of nozzles 16. In the embodiment shown in FIG. 1, the nozzles 16 are disposed in the vicinity of the nozzle 2 of the crucible 1, however, the nozzles 16 may be provided adjacent to the substrate 12. As occasion demands, an acceleration electrode 17 to which negative potential with respect to the crucible 1 is applied by a power source (not shown) for accelerating ionized Be vapors may be provided between the ionization chamber 6 and the substrate 12. In addition, a heater for the substrate 12 (not shown) may be provided in the vicinity of the substrate 12.

These elements for the BeO film forming apparatus explained hereinabove are arranged within a vacuum vessel (not shown) held by any suitable supporting members, and the vessel is evacuated at a high vacuum state in the order of at least $10^{-5}$ Torr.

The BeO film and the method of producing the same using the apparatus explained hereinabove will now be described hereinafter.

First, the crucible 1 is filled with the metal Be 3 which is of any suitable shape, and the vessel within which each of the components explained hereinabove is accomodated is evacuated at least $10^{-5}$ Torr or less. In this state, oxygen 16a is supplied to the vacuum vessel from the nozzle 16 through the oxygen supply pipe 15, and the pressure within the vacuum vessel is maintained in the order of $10^{-6}$ Torr–$10^{-3}$ Torr. When the pressure for introducing the oxygen 16a into the vacuum vessel is smaller, the formation of the BeO film of superior quality is expected. However, in order to form the BeO film under the less oxygen pressure, the vacuum vessel must be evacuated at a high vacuum or ultra high vacuum prior to the introduction of the oxygen into the vacuum vessel, and the formation speed of the BeO film is adversely affected thereby. Accordingly, it is practical to adjust the amount of the oxygen introducing the vacuum vessel so that the pressure within the vacuum vessel may be $10^{-6}$ Torr–$10^{-3}$ Torr.

Then, the heater 4 is actuated to heat the crucible 1 for melting the metal Be filled in the crucible 1 and generating vapor 3a of the metal Be within the crucible 1. The temperature for heating the metal Be is determined based on environmental space around the crucible 1, namely, the pressure within the vacuum vessel which can be expressed as $P/P_o \geq 10^2$ preferably $P/P_o \geq 10^4$ in which P represents the vapor pressure of the metal Be within the crucible 1 and $P_o$ represents the pressure within the vacuum vessel. For instance, the vapor pressure P is maintained at approximately $5 \times 10^{-2}$ Torr at the heating temperature of 1,300° C. and $1 \times 10^{-1}$ Torr at the heating temperature of 1,380° C. taking the melting point of the metal Be which is 1280° C. into consideration. Accordingly, the heating temperature of 1,300°–1,400° C. is sufficient enough when the pressure within the vacuum vessel is $10^{-6}$ Torr–$10^{-6}$ Torr. In order to speed up the film formation by increasing the vapor pressure P, the heating temperature may be increased within extent of not damaging the quality of the BeO film to be formed.

The vapor 3a of the metal Be is ejected from the nozzle 2 to the outside of the crucible 1 due to the pressure difference between the crucible 1 and the vacuum vessel. The ejected vapor is imparted with kinetic energy corresponding to the ejection velocity and directed toward the substrate 12 in a vapor stream 3b. In this instance, if the vapor is forced into a supercooled state due to the adiabatic expansion at the time of ejecting from the nozzle 2 by changing the shape of the nozzle 2 and the pressure P and $P_o$ so as to meet the conditions explained hereinabove or modifying the shape of the nozzle 2 of the crucible 1, it is possible to have the vapor converted into clusters which are large aggregates of the vapor of Be atoms or moleculars loosely coupled by Van der Waals force. The formation of the clusters makes it possible to improve ionization efficiency in the ionization chamber 6 which will be explained hereinafter and also to form superior films on the substrate 12.

The vapor stream 3b imparted with the kinetic energy due to the ejection from the crucible 1 is passed through the ionization chamber 6 where at least a part of the vapor stream 3b is ionized. The ionization of the vapor 3b is effected in such a manner that electrons emitted from the flament 8 when energized and heated are accelerated by the voltage of 100–1000 V which is applied between the filament 8 and the net-shaped anode 7 and then impinged upon the vapor stream 3b passing through the net-shaped anode 7. When the vapor stream 3b of the metal Be spouted from the nozzle 2 is in the form of the cluster, at least one of the atom groups constituting each cluster is ionized in the ionization chamber 6 by the electron bombardment, thereby to form cluster ions. Furthermore, the oxygen spouted from the nozzle 16 is passed through the ionization chamber 6 where the oxygen is subjected to the electron bombardment and partially ionized.

The ionized Be atoms and the non-ionized neutral Be atoms or the Be clusters and the cluster ions, while involving the oxygen in the route of the vapor stream 3b, are directed toward the substrate 12 as an oxygen complex and, when the shutter 13 is open, the vapor stream 3b is brought into collision with the surface of the substrate 12 to form a BeO film 20 thereon. In this instance, as explained hereinabove, a part of the Be vapor stream 3b impinging upon the substrate 12 is ionized by passing through the ionization chamber 6, and the electric field of the ion is effectively acted upon initial state of the film formation. That is, the electric field of the ion promotes the formation of nuclei for the crystal growth and is effectively acted upon the formation of island regions gathering the atoms at the center of the nuclei thus formed which is generally known as a coalescence. Furthermore, the ionization is effective to promote reaction between the Be and oxygen and to form the film which is excellent in crystalline properties corresponding to the stoichiometry.

According to the method of the present invention, the Be vapor stream 3b is impinged on the substrate 12 with the kinetic energy imparted at the time of the ejection. Therefore, highly adhesive deposition of the BeO film 20 on the substrate 12 can be achieved due to the implantation energy, which is in turn effective to contribute the increase in the packing density of the BeO film 20 and the improvement of the crystalline state and to form the film of excellent quality. The ionization rate of the Be vapor 3a can be controlled by adjusting the acceleration voltage applied to the anode 7 and changing the ionization current extracted from the filament 8, thereby to control the crystalline state and other characteristics of the BeO film to be deposited on the substrate.

In the above embodiment, the kinetic energy of the Be vapor is generated by ejecting the vapor 3a out of the crucible 1 due to the pressure difference between the crucible 1 and the vacuum vessel. However, it is to be understood that the vapor stream 3b partially ionized by passing through the ionization chamber 6 may be accelerated by an electric field so as to increase the kinetic energy, thereby to control or improve the crystalline state. For instance, if the acceleration voltage of 0–10 KV which is negative with respect to the crucible 1 is applied to the acceleration electrode 17, the particles in the vapor stream 3b ionized by passing through the ionization chamber 6 are accelerated and imparted with the kinetic energy, which is effectively acted upon the improvement or control of the crystalline state at the time of the formation of the film, and the BeO film 20 excellent in quality can be produced. This is particularly effective when a monocrystalline substrate, such as, for example, sapphire or sodium chloride (NaCl) is used as the substrate 12. In this instance, the crystalline state of the BeO film to be formed can be advantageously controlled by changing the acceleration voltage applied to the acceleration electrode 17 in view of the crystalline surface of the substrate 12. Furthermore, the energy imparted to the ionized particles by the electric field is effectively acted upon the improvement in the adhesion strength. It is to be understood that the acceleration electrode 17 is not indispensable in the apparatus according to the present invention, but accelerating electric field may be created between the substrate holder 11 and the crucible 1 when the substrate holder 11 is made of electric conductive materials. When the substrate 12 is made of substance which is soluble in water or organic solvent, such as, for example, sodium chloride (NaCl), and the BeO film is formed on the substrate surface, the BeO film which is transparent, extremely thin and excellent in the crystalline state can be obtained by separating the BeO film from the substrate 12 by dissolving the substrate 12. This BeO film is particularly suitable for use in a window frame of X-ray tube.

Referring now to the characteristics of the BeO film produced by the method of the present invention and the conditions for producing the same, the crucible 1 was filled with the Be in the form of flake and heated at the temperature of 1,300° C. by the heater 4 shown in FIG. 1. The oxygen pressure within the vacuum vessel was kept at $3 \times 10^{-4}$ Torr by supplying oxygen from the oxygen supply pipe 15 and the Be vapor stream 3b was generated by the pressure difference between the crucible 1 and the vacuum vessel. The ionization current in the ionization chamber 6 which is extracted from the filament 8 by the voltage applied between the anode 7 and the filament 8 was 300 mA. The vapor stream 3b, at least a part thereof, was ionized by passing through the ionization chamber, and brought into collision with the surface of the substrate 12 to form the BeO film 20 thereon. The film thickness of the BeO film thus obtained was 1.6 μm. The substrate 12 was heated at the temperature of 300° C.–500° C., however, no acceleration voltage was applied to the substrate 12. As the substrate 12, glass plate was used.

Figure 3:
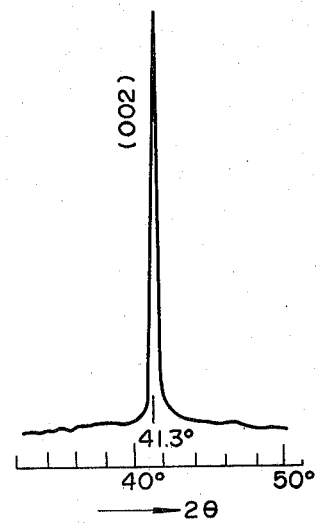
FIG. 3 is an X-ray diffraction pattern of a beryllium oxide (BeO) film showing the preferential orientation of the C-axis perpendicular to the substrate surface.
Figure 2:
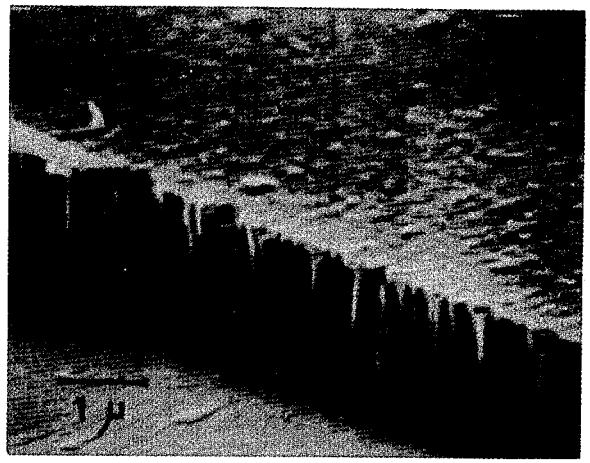
FIG. 2 is an electron micrograph showing a scanning electron microscope (SEM) structure of a beryllium oxide (BeO) film according to the present invention.
Figure 4:
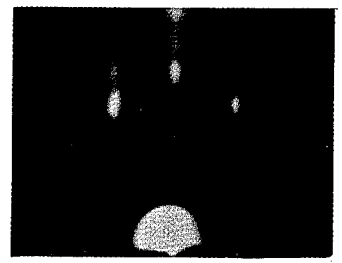
FIG. 4 is an electron micrograph showing a reflective high energy electron diffraction (RHEED) pattern of a beryllium oxide (BeO) film according to another embodiment of the present invention.

FIG. 2 shows the scanning electron microscope structure of the BeO film 20 formed under the conditions described hereinabove and the X-ray diffraction pattern thereof is shown in FIG. 3. It is apparent from FIGS. 2 and 3 that columnar structures which are peculiar to a hexagonal crystalline structure can be recognized in the BeO film 20 thus obtained and that the BeO film 20 deposited on the glass substrate is preferentially orientated to the C-axis, (002) plane of the substrate. FIG. 4 shows the reflective high energy electron diffraction (RHEED) pattern of the BeO film 20 epitaxially grown on the (0001) plane of monocrystalline sapphire substrate under the same condition as explained hereinabove. The RHEED pattern shown in FIG. 4 is somewhat obscure, because the BeO film 20 is extremely high in the surface resistance and the electron beam irradiated on the BeO film is charged on its surface. However, it is apparent that the BeO film 20 is epitaxially grown to be regulated by the C-axis of the substrate 12.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A method for preparing a film of beryllium oxide comprising:
   heating metallic beryllium in a closed crucible having at least one injection nozzle, thereby vaporizing said beryllium metal;
   injecting said vapor through said nozzle into an evacuated chamber, whereby a stream of beryllium atoms is produced, while simultaneously injecting oxygen into said chamber around said stream to provide an atmosphere of oxygen having a pressure not greater than $10^{-2}$ of the vapor pressure in said crucible;
   ionizing at least part of said vapor stream by irradiating said vapor stream with electron beams whereby a vapor stream containing ionized and unionized atoms is produced; and
   permitting said vapor stream containing ionized and unionized atoms to impinge on a substrate surface together with said oxygen thereby forming a film of beryllium oxide on said substrate.

2. The method of claim 1, wherein said vapor stream is accelerated by an electric field.

3. The method of claim 1, wherein said substrate is made of a substance which is soluble in water or organic solvents.

4. The method of claim 1, wherein said substrate is maintained at a temperature ranging from 300°–500° C.

5. The method of claim 1, wherein the vapor pressure ratio $P/P_o$ within the vacuum vessel is $\geq 10^2$, wherein P is the vapor pressure of the beryllium metal in the crucible and $P_o$ is the vapor pressure within the vacuum vessel.

6. The method of claim 1, wherein the oxygen pressure in said evacuated chamber ranges from $10^{-6}$ Torr to $10^{-3}$ Torr.

* * * * *